US012369388B2

(12) United States Patent
Wang et al.

(10) Patent No.: US 12,369,388 B2
(45) Date of Patent: Jul. 22, 2025

(54) SEMICONDUCTOR DEVICES WITH TUNABLE LOW-K INNER AIR SPACERS

(71) Applicant: Taiwan Semiconductor Manufacturing Co., Ltd., Hsinchu (TW)

(72) Inventors: Chen-Han Wang, Zhubei (TW); Keng-Chu Lin, Ping-Tung (TW); Shuen-Shin Liang, Hsinchu County (TW); Tetsuji Ueno, Hsinchu (TW); Ting-Ting Chen, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 122 days.

(21) Appl. No.: 17/815,388

(22) Filed: Jul. 27, 2022

(65) Prior Publication Data
US 2022/0367278 A1 Nov. 17, 2022

Related U.S. Application Data

(62) Division of application No. 16/916,397, filed on Jun. 30, 2020, now Pat. No. 11,848,238.

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/024* (2025.01); *H10D 30/62* (2025.01);
(Continued)

(58) Field of Classification Search
CPC ......... H01L 29/78696; H01L 29/42392; H01L 21/823431; H01L 21/823821; H01L 21/845; H01L 27/0886; H01L 27/0924; H01L 27/1211; H01L 27/10828; H01L 27/10879; H01L 29/41791; H01L 29/66795–66818; H01L 29/785–7856; H01L 2029/7857–7858; H01L 2924/13067; H01L 29/0673; H01L 29/66439; H01L 29/775; H01L 29/66553; H01L 21/823468; H01L 21/823864;
(Continued)

(56) References Cited

U.S. PATENT DOCUMENTS 9,093,530 B2 7/2015 Huang et al.
9,105,490 B2 8/2015 Wang et al.
(Continued)

*Primary Examiner* — Younes Boulghassoul
(74) *Attorney, Agent, or Firm* — Sterne, Kessler, Goldstein & Fox P.L.L.C.

(57) ABSTRACT

The present disclosure describes a method of fabricating a semiconductor structure that includes forming a fin structure on a substrate, forming a polysilicon gate structure on a first portion of the fin structure, forming an opening in a second portion of the fin structure, wherein the first and second portions of the fin structure is adjacent to each other, forming a recess laterally on a sidewall of the first portion of the fin structure underlying the polysilicon gate structure, and forming an inner spacer structure within the recess. The inner spacer structure comprises an inner air spacer enclosed by a first dielectric spacer layer and a second dielectric spacer layer.

20 Claims, 11 Drawing Sheets

(51) Int. Cl.
  *H10D 30/62* (2025.01)
  *H10D 30/67* (2025.01)
  *H10D 62/10* (2025.01)
  *H10D 64/01* (2025.01)
  *H10D 64/66* (2025.01)
  *H10D 84/01* (2025.01)

(52) U.S. Cl.
  CPC ..... *H10D 30/6735* (2025.01); *H10D 30/6757* (2025.01); *H10D 62/116* (2025.01); *H10D 64/015* (2025.01); *H10D 64/017* (2025.01); *H10D 64/018* (2025.01); *H10D 64/021* (2025.01); *H10D 64/679* (2025.01); *H10D 84/013* (2025.01); *H10D 84/0133* (2025.01); *H10D 84/0147* (2025.01); *H10D 84/0158* (2025.01)

(58) Field of Classification Search
  CPC ............. H01L 29/6656; H01L 29/6653; H01L 29/0649–0653; H01L 21/764; H01L 21/7682; H01L 29/515; H01L 29/4991; H01L 2221/1042–1047; H01L 21/823481; H01L 21/823878; H01L 29/0653; H10D 30/40–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 62/115; H10D 62/116; H10D 64/687; H10D 64/679; H10D 84/0147; H10D 84/0184; H10D 64/021; H10D 64/015; H10D 64/018; H10D 64/675
  See application file for complete search history.

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 10,211,307 B2 | 2/2019 | Ching et al. |
| 2017/0110554 A1* | 4/2017 | Tak .................. H01L 29/42392 |
| 2017/0221893 A1 | 8/2017 | Tak et al. |
| 2019/0067441 A1* | 2/2019 | Yang .................. H01L 29/4908 |
| 2019/0157414 A1 | 5/2019 | Ando et al. |
| 2019/0157444 A1* | 5/2019 | Yang .................. H01L 29/6681 |
| 2019/0305104 A1 | 10/2019 | Xie et al. |
| 2019/0393357 A1 | 12/2019 | Chen et al. |
| 2020/0075395 A1 | 3/2020 | Lin et al. |
| 2020/0126798 A1 | 4/2020 | Lin et al. |
| 2020/0286992 A1* | 9/2020 | Song .................. H01L 29/0673 |
| 2020/0357911 A1* | 11/2020 | Frougier .............. H01L 29/775 |
| 2021/0020741 A1* | 1/2021 | Wu .................... H01L 29/0653 |
| 2021/0043727 A1* | 2/2021 | Frougier ........... H01L 29/66553 |
| 2021/0098627 A1* | 4/2021 | Liaw .................. H01L 29/775 |
| 2021/0126106 A1* | 4/2021 | Wang ................. H01L 29/6656 |
| 2021/0175367 A1 | 6/2021 | Chen et al. |
| 2021/0234017 A1* | 7/2021 | Yao .................. H01L 21/02603 |
| 2021/0351276 A1* | 11/2021 | Bao .................. H01L 21/02603 |
| 2021/0391466 A1* | 12/2021 | Yeong ................ H01L 29/6653 |
| 2021/0407856 A1 | 12/2021 | Wang et al. |

* cited by examiner

SEMICONDUCTOR DEVICES WITH TUNABLE LOW-K INNER AIR SPACERS

CROSS-REFERENCE TO RELATED APPLICATION

This application is a divisional of U.S. Non-Provisional patent application Ser. No. 16/916,397, filed on Jun. 30, 2020, titled "Tunable Low-K Inner Air Spacers of Semiconductor Devices," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1A:
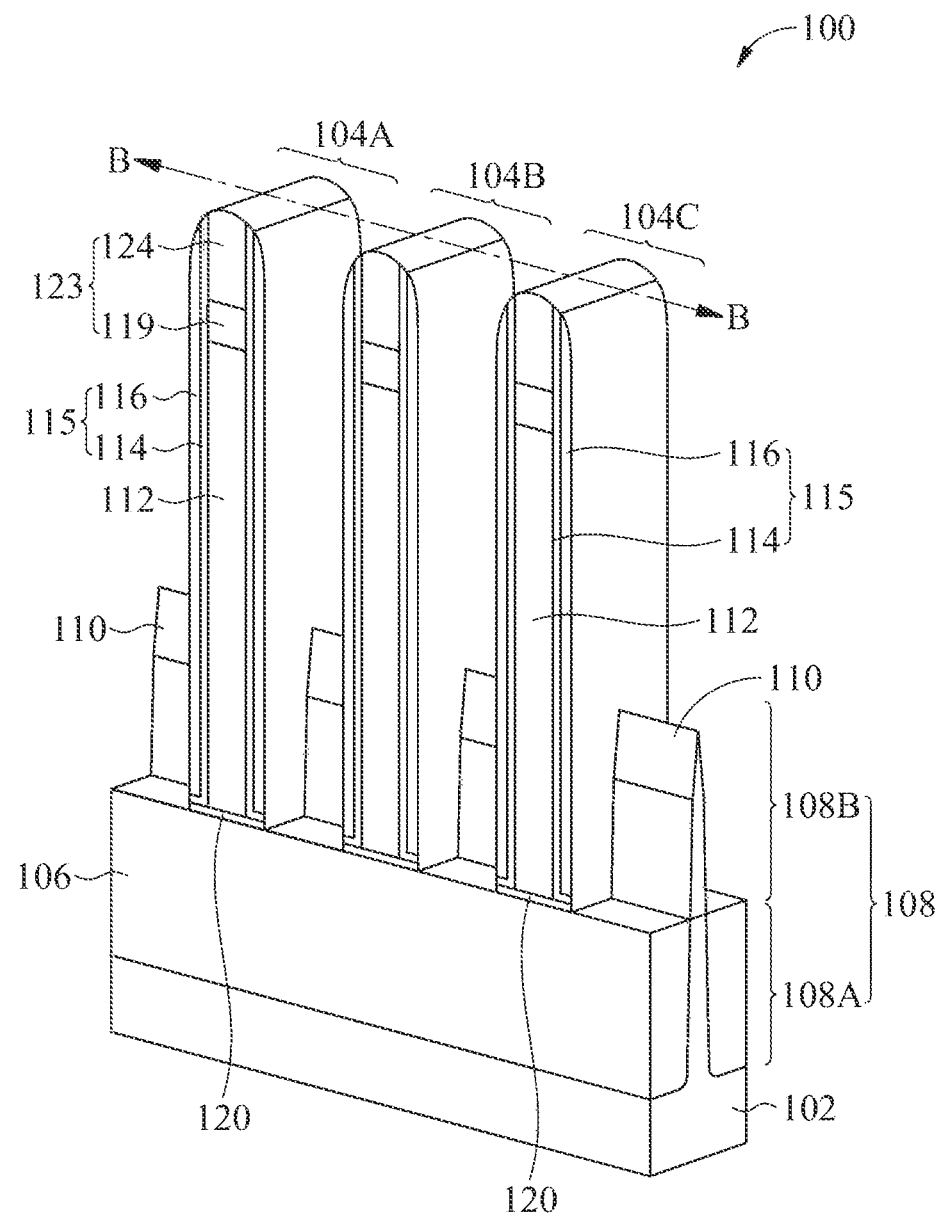
FIGS. 1A and 1B-1C illustrate a partial isometric view and partial cross-sectional views of a semiconductor device with tunable low-k inner air spacers, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical," means nominally perpendicular to the surface of a substrate.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process, Spacers are formed alongside the patterned sacrificial layer using a self-aligned process. The sacrificial layer is then removed, and the remaining spacers may then be used to pattern the fin structures.

The performance of semiconductor devices increases with advances in semiconductor technology. For example, complementary metal-oxide-semiconductor (CMOS) transistors are increasingly faster with every new generation of semiconductor technology. One way to improve CMOS transistor speed is to reduce the delay of the device. For example, reducing the resistance-capacitance (RC) delay of the CMOS transistor improves speed and consequently, device performance.

One consideration to reduce the RC delay of a transistor is to use a dielectric material with a lower dielectric constant (k value). Such a dielectric material is often referred to as a "low-k dielectric material." For example, the use of a low-k dielectric material as a spacer between a CMOS gate structure and an epitaxial source/drain (S/D) region of the CMOS transistor can lower a capacitance between the CMOS gate structure and the epitaxial S/D region. With lower capacitance, the RC delay of the CMOS transistor can be reduced. Compared with other low-k dielectric materials, an air spacer has lower k value of about 1. Therefore, an inner spacer structure with an inner air spacer sealed by low-k spacer layers between the CMOS gate structure and the epitaxial S/D region can provide lower capacitance, and consequently, smaller RC delay and faster speed for the CMOS transistor.

Various embodiments in accordance with the present disclosure provides example structures of tunable low-k inner air spacers in field effective transistors (FETs) (e.g., around (GAA) FETs, finFETs, GAA finFETs, and/or planar FETs) in a semiconductor device and/or in an integrated circuit (IC) and example methods for fabricating the same. According to some embodiments, a tunable low-k inner air spacer can be formed between a gate structure and an epitaxial S/D region of a FET and can be sealed by a first dielectric spacer layer and a second dielectric spacer layer. In some embodiments, the first dielectric spacer layer and the second dielectric spacer layer can be formed by a two-step low-k dielectric spacer layer deposition method and the first and second dielectric spacer layers can include dielectric materials different from each other. In some embodiments, the first dielectric spacer layer and the second dielectric spacer layer can be formed by a one-step low-k dielectric spacer layer deposition method and the first and second dielectric spacer layers can include the same dielectric material(s). In some embodiments, the vertical and horizontal dimensions of the tunable low-k inner air spacer can be tuned by the thicknesses of the first dielectric spacer layer and the second dielectric spacer layer, respectively. In some embodiments, the tunable low-k inner air spacer can include an air gap having a dielectric constant of about 1 and can reduce the dielectric constant of the inner spacer structure including the tunable low-k inner air spacer and the first and second dielectric spacer layers. Thus, the presence of the tunable low-k inner air spacer can reduce the capacitance between the gate structure and the epitaxial fin regions. In some embodiments, the device performance of FETs having tunable low-k inner air spacers can be improved by about 2% to about 15% compared to the device performance of FETs without such tunable low-k inner air spacers.

Figures 1B, 1C:
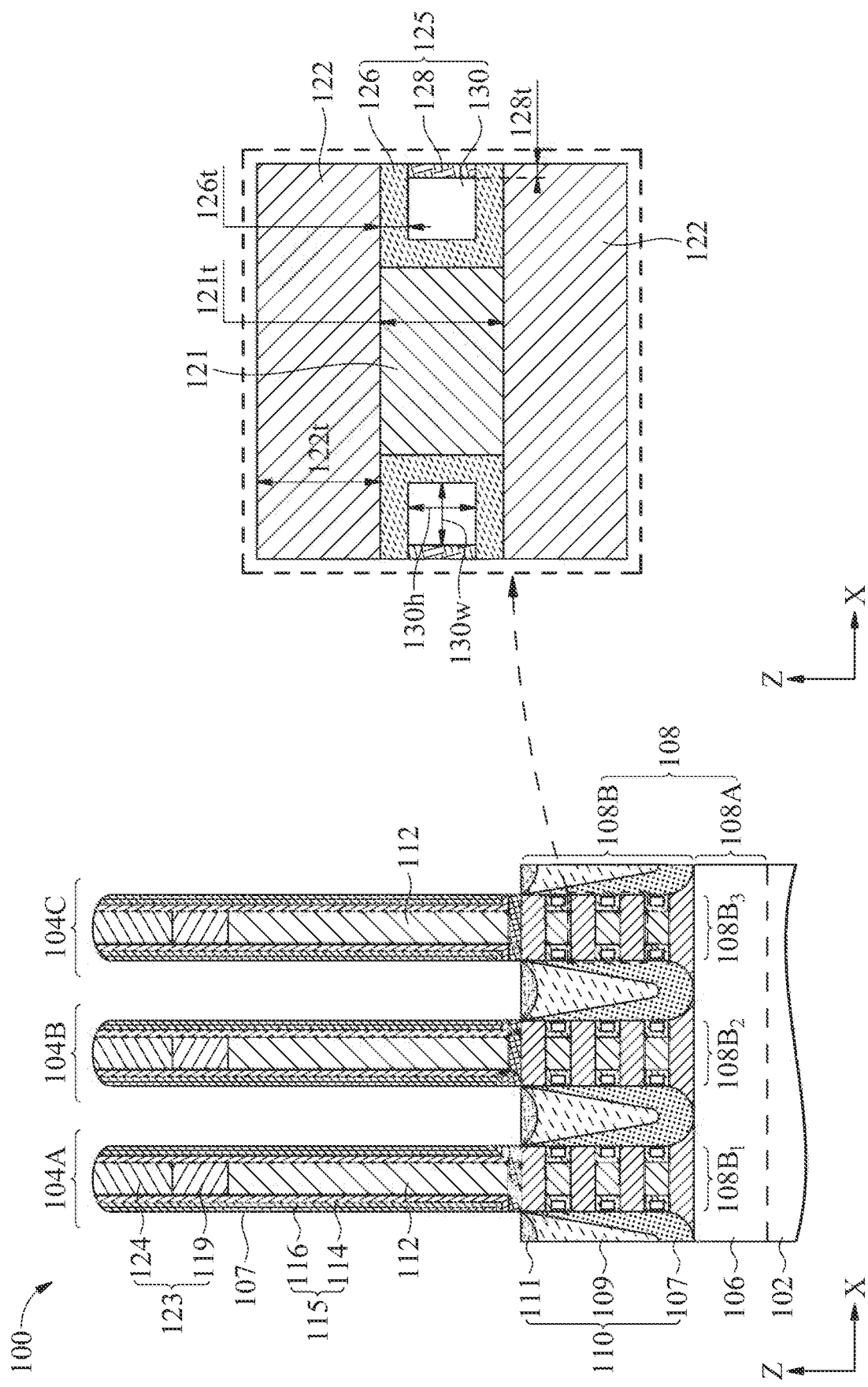

FIG. 1A illustrates a partial isometric view of a semiconductor device 100 with tunable low-k inner air spacers, in accordance with some embodiments. FIG. 1B illustrates a partial cross-sectional view along line B-B of semiconductor device 100 with tunable low-k inner air spacers, in accordance with some embodiments. FIG. 1C illustrates a zoomed-in area C of the cross-sectional view of FIG. 1B, in accordance with some embodiments. In some embodiments, FIG. 1A represents a partial isometric view of a GAA FET 100. For simplicity, gate structures 112 of FIG. 1A are not shown in details. FIG. 1B includes cross-sectional details of gate structures 112. In some embodiments, FIGS. 1A-1C show only a portion of an IC layout where the spacing between the fin structures (e.g., the fin pitch), the dimensions of the fin structures, and the dimensions of the gate structures can be similar or different from the ones shown in FIGS. 1A-1C. Additionally, the isometric and cross-sectional views of semiconductor device 100 in FIGS. 1A-1C and the subsequent figures in FIGS. 3-10 are for illustrative purposes and are not drawn to scale. FIGS. 1A-1C and the subsequent figures in FIGS. 3-10 may not reflect the actual geometry of the actual structures, features, or films. Some structures, films, or geometries may have been deliberately augmented for illustrative purposes.

Referring to FIGS. 1A-1C, semiconductor device 100 can be formed on a substrate 102 and can include finFETs 104A-104C. In some embodiments, finFETs 104A-104C can be all p-type finFETs (PFETs) or n-type finFETs (NFETs) or one of each conductivity type finFETs. Though three finFETs are shown in FIGS. 1A-1B, semiconductor device 100 can have any number of finFETs. The discussion of elements of finFETs 104A-104C with the same annotations applies to each other, unless mentioned otherwise. In addition, semiconductor device 100 can be incorporated into an integrated circuit through the use of other structural components such as metal gate structures, gate contact structures, conductive vias, conductive lines, dielectric layers, passivation layers, etc., that are not shown in FIGS. 1A-1C for the sake of clarity.

In some embodiments, semiconductor device 100 can further include shallow trench isolation (STI) region 106, tin structure 108, polysilicon gate structures 112, and gate spacers 115 disposed on opposite sides of polysilicon gate structures 112.

FinFETs 104A-104C can be formed on a substrate 102. Substrate 102 can be a semiconductor material such as, but not limited to, silicon. In some embodiments, substrate 102 can include a crystalline silicon substrate (e.g., wafer). In some embodiments, substrate 102 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI region 106 can be configured to provide electrical isolation between finFETs 104A-104C from each other and from neighboring finFETs with different fin structures (not shown) on substrate 102 and/or neighboring active and passive elements (not shown) integrated with or deposited on substrate 102. STI region 106 can be made of a dielectric material. In some embodiments, STI region 106 can include silicon oxide, silicon nitride, silicon oxynitride, fluorine-doped silicate glass (FSG), a low-k dielectric material, and/or other suitable insulating materials. In some embodiments, STI region 106 can include a multi-layered structure.

Fin structure 108 of semiconductor device 100 can extend along an X-axis and through finFETs 104A-104C. Fin structure 108 can include fin base portion 108A and fin top portion 108B disposed on fin base portion 108A. In some embodiments, fin base portion 108A can include material similar to substrate 102. Fin base portion 108A can be formed from a photolithographic patterning and an etching of substrate 102. In some embodiments, fin top portion 108B can include stacked fin portions 108B$_1$, 108B$_2$, and 108B$_3$ and epitaxial fin regions 110. Each of stacked fin portions 108B$_1$-108B$_3$ can include first and second semiconductor layers 121 and 122, which can be in the form of nanostructures (e.g., nanowires or nanosheets), stacked in an alternating configuration. Each semiconductor layer 121 can be replaced by a metal gate structure as described in further detail with reference to FIG. 10. Each semiconductor layer 122 can form a channel region underlying polysilicon gate structures 112, which can be replaced by metal gate structures 1012 as described in FIG. 10.

First and second semiconductor layers 121 and 122 can be epitaxially grown and can include semiconductor materials different from each other. In some embodiments, first and second semiconductor layers 121 and 122 can include semiconductor materials similar to or different from substrate 102. In some embodiments, first and second semiconductor layers 121 and 122 can include semiconductor materials with oxidation rates and/or etch selectivity different from each other. In some embodiments, each of first and second semiconductor layers 121 and 122 can include silicon germanium (SiGe) with Ge in a range from about 15 atomic percent to about 50 atomic percent with any remaining atomic percent being Si or can include Si without any substantial amount of Ge.

The semiconductor materials of first and/or second semiconductor layers 121 and 122 can be undoped or can be in-situ doped during their epitaxial growth process using: (i) p-type dopants, such as boron, indium, or gallium; and/or (ii) n-type dopants, such as phosphorus or arsenic. First and second semiconductor layers 121 and 122 can have respective vertical dimensions 121$t$ and 122$t$ (e.g., thicknesses) along a Z-axis, each ranging from about 6 nm to about 10 nm. Vertical dimensions 121$t$ and 122$t$ can be equal to or different from each other.

In some embodiments, epitaxial fin regions 110 can be grown on portions of fin base portion 108A that are not underlying polysilicon gate structures 112, as illustrated in FIGS. 1A and 1B. In some embodiments, epitaxial fin regions 110 can have any geometric shape, for example, polygonal, elliptical, or circular. Epitaxial fin regions 110 can include an epitaxially-grown semiconductor material. In some embodiments, the epitaxially grown semiconductor material is the same material as the material of substrate 102. In some embodiments, the epitaxially-grown semiconductor material can include a different material from the material of substrate 102. The epitaxially-grown semiconductor material can include: (i) a semiconductor material such as, germanium or silicon; (ii) a compound semiconductor material such as, gallium arsenide and/or aluminum gallium arsenide; or (iii) a semiconductor alloy such as, silicon germanium and/or gallium arsenide phosphide.

Epitaxial fin regions 110 can be p-type or n-type for finFETs 104A-104C. In some embodiments, epitaxial fin regions 110 can be the same or opposite doping type with respect to each other. P-type epitaxial fin regions 110 can include SiGe and can be in-situ doped during an epitaxial growth process using p-type dopants, such as boron, indium, or gallium. In some embodiments, n-type epitaxial fin regions 110 can include Si and may be in-situ doped during an epitaxial growth process using n-type dopants, such as phosphorus or arsenic.

In some embodiments, epitaxial fin regions 110 can have a plurality of epitaxial fin sub-regions that can differ from each other based on, for example, doping concentration, and/or epitaxial growth process conditions. Referring to FIGS. 1A and 1B, epitaxial fin regions 110 can include first epitaxial fin sub-regions 107, second epitaxial fin sub-regions 109, and third epitaxial fin sub-regions 111. First epitaxial fin sub-regions 107, second epitaxial tin sub-regions 109, and third epitaxial fin sub-regions 111 can have varying dopant concentration with respect to each other, according to some embodiments. Referring to FIGS. 1A and 1B, fin structure 108 can be current-carrying structures for respective finFETs 104A-104C. Epitaxial fin regions 110 can be configured to function as source/drain (S/D) regions of respective finFETs 104A-104C, Channel regions of finFETs 104A-104C can be formed in portions of their respective fin base portions 108A underlying polysilicon gate structures 112. Though finFETs 104A-104C are shown to have fin structure 108 with stacked fin portions 108B$_1$-108B$_3$ on fin base portion 108A, other fin structures (e.g., a single layered fin structure etched from or epitaxially grown on substrate 102) are within the scope and spirit of this disclosure.

In some embodiments, polysilicon gate structures 112 can be formed on fin structure 108 over substrate 102. In some embodiments, polysilicon gate structures 112 can be formed by blanket deposition of polysilicon, followed by photolithography and etching of the deposited polysilicon. In some embodiments, protective oxide layers 120 can be disposed between fin structure 108 and polysilicon gate structures 112. The formation of protective oxide layers 120 can include blanket depositing a layer of oxide material on fin structure 108 followed by a high temperature anneal process. Protective oxide layers 120 can include a suitable oxide material, such as silicon oxide. In some embodiments, protective oxide layers 120 can protect stacked fin portions $108B_1$-$108B_3$ during subsequent processing steps.

In some embodiments, a hard mask layer 123 can be disposed on polysilicon gate structures 112. In some embodiments, hard mask layer 123 can include a nitride layer 119 and an oxide layer 124 for profile control of polysilicon gate structures 112. Hard mask layer 123 can protect polysilicon gate structures 112 from subsequent processing steps (e.g., during formation of gate spacers 115 and/or epitaxial fin regions 110).

Gate spacers 115 can be disposed on sidewalk of polysilicon gate structures 112 Gate spacers 115 can include insulating material such as, silicon oxide, silicon nitride, a low-k material, or a combination thereof. Gate spacers 115 can have a low-k material with a dielectric constant less than 3.9 (e.g., less than 3.5, 3, or 2.8). In some embodiments, gate spacers 115 can include a first gate spacer 114 and a second gate spacer 116. In some embodiments, first and second gate spacers 114 and 116 can include different insulating materials with different dielectric constants. In some embodiments, gate spacers 115 can be configured to protect polysilicon gate structures 112 during subsequent processing steps (e.g., during formation of epitaxial fin regions 110). In some embodiments, a dummy nitride layer 117 can be disposed on gate spacers 115 to define regions to grow n-type or p-type epitaxial fin regions 110.

In some embodiments, semiconductor device 100 can further include inner spacer structures 125 disposed between semiconductor layers 122 along a Z-axis and between semiconductor layers 121 and epitaxial fin regions 110 along an X-axis. In some embodiments, inner spacer structures 125 can include a first dielectric spacer layer 126, a second dielectric spacer layer 128, and an inner air spacer 130 (also referred to as "a tunable low-k inner air spacer"). In some embodiments, first dielectric spacer layer 126 and second dielectric spacer layer 128 can include a dielectric material composed of silicon, oxygen, carbon, and/or nitrogen. The concentrations of silicon, oxygen, carbon, and nitrogen in the material for first dielectric spacer layer 126 and second dielectric spacer layer 128 can be different. In some embodiments, each of first dielectric spacer layer 126 and second dielectric spacer layer 128 can include a layer of silicon oxycarbonitride (SiOCN), a layer of silicon carbon nitride (SiCN), a layer of silicon oxide carbide (SiOC), or a combination thereof. In some embodiments, first dielectric spacer layer 126 can have a thickness $126t$ ranging from about 1 nm to about 3 nm and a dielectric constant ranging from about 3.5 to about 4. In some embodiments, second dielectric spacer layer 128 can have a thickness $128t$ ranging from about 1 nm to about 3 nm and a dielectric constant ranging from about 3.5 to about 4. If thicknesses $126t$ and $128t$ are smaller than 1 nm, inner air spacer 130 may not be protected by first dielectric spacer layer 126 and second dielectric spacer layer 128. If thicknesses $126t$ and $128t$ are larger than 3 nm, the dimensions of inner air spacer 130 may be reduced by first dielectric spacer layer 126 and second dielectric spacer layer 128.

In some embodiments, inner air spacer 130 can be disposed between semiconductor layers 121 and epitaxial fin regions 110. Inner air spacer 130 can be sealed on all sides by first dielectric spacer layer 126 and second dielectric spacer layer 128 and can be wrapped around semiconductor layers 122 along a Z-axis. In some embodiments, inner air spacer 130 can include an air gap (also referred to as "air gap 130") having a dielectric constant of about 1. In some embodiments, inner air spacer 130 can have a dimension along an X-axis $130w$ (e.g., width) ranging from about 2 nm to about 6 nm. In some embodiments, inner air spacer 130 can have a dimension along a Z-axis $130h$ (e.g., height) ranging from about 4 nm to about 10 nm. In some embodiments, inner spacer 130 can have a ratio of a dimension along a Z-axis to a dimension along an X axis ranging from about 0.5 to about 5. In some embodiments, the dimensions of inner air spacer 130 can be tuned by thickness $126t$ of first dielectric spacer layer 126 and thickness $128t$ of second dielectric spacer layer 128. According to some embodiments, the dielectric constant of inner spacer structure 125 with inner air spacer 130 can be reduced compared to inner spacer structures without inner air spacers. The sealing of inner air spacer 130 by first dielectric spacer layer 126 and second dielectric spacer layer 128 can prevent epitaxial fin regions 110 from growing into inner air spacer 130. The growth of epitaxial fin regions 110 into inner air spacer 130 can increase device current leakage between gate structures and epitaxial fin regions 110. Thus, the formation of epitaxial defects in epitaxial fin regions 110 can be prevented by confining the epitaxial growth of epitaxial fin regions 110 on low-k first and second dielectric spacer layers 126 and 128 of inner spacer structures 125, as shown in FIGS. 1B-1C.

Based on the disclosure herein, it will be recognized that cross-sectional shapes of semiconductor device 100 and its elements (e.g., fin structure 108, STI regions 106, polysilicon gate structures 112, epitaxial fin regions 110, gate spacers 115, and/or inner spacer structures 125) are illustrative and are not intended to be limiting.

Figure 2:
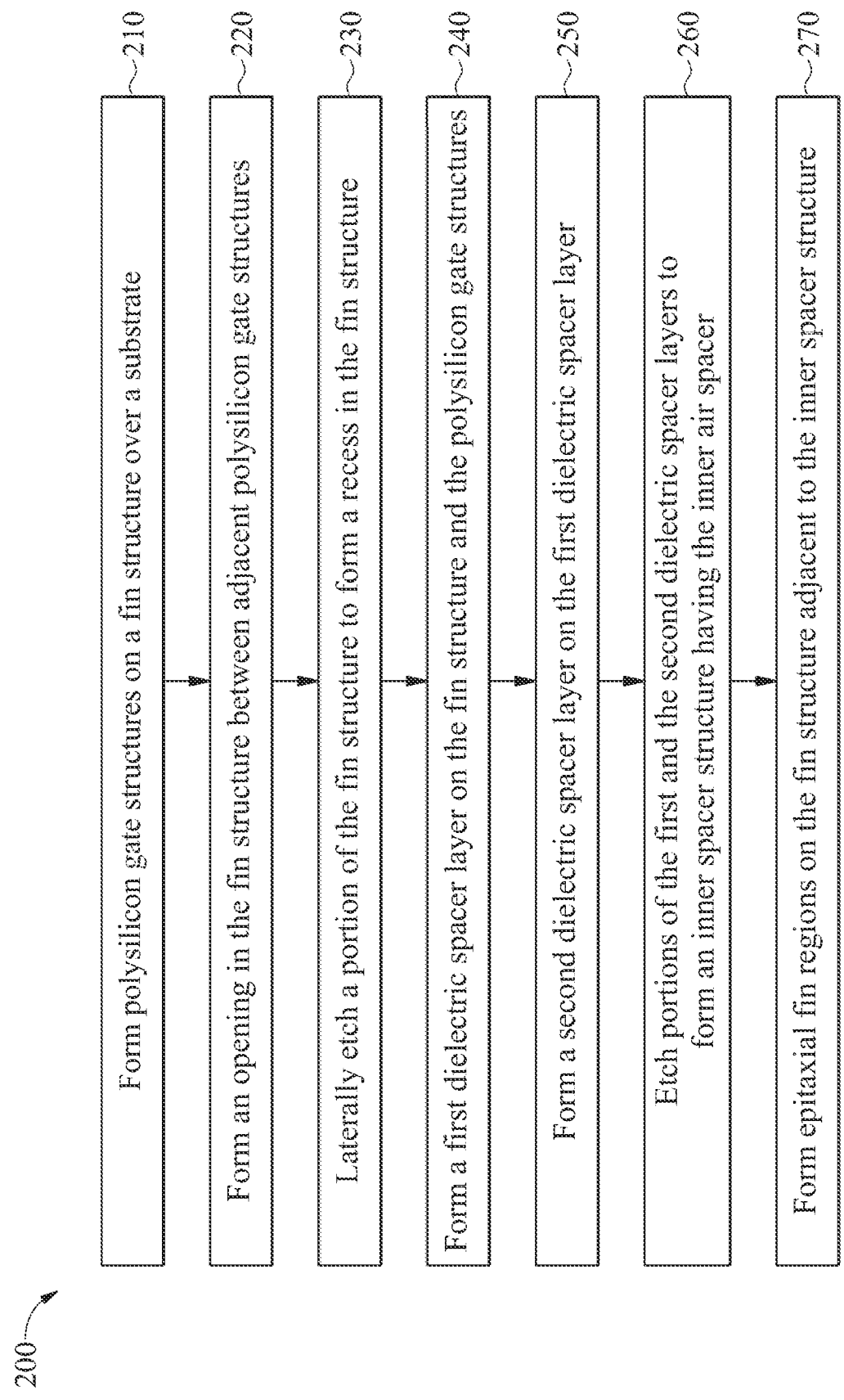
FIG. 2 is a flow diagram of an example method for fabricating a semiconductor device with tunable low-k inner air spacers, in accordance with some embodiments.

FIG. 2 is a flow diagram of an example method 200 for fabricating semiconductor device 100 with tunable low-k inner air spacers, in accordance with some embodiments. For illustrative purposes, the operations illustrated in FIG. 2 will be described with reference to the example fabrication process for fabricating semiconductor device 100 as illustrated in FIGS. 3-10. FIGS. 3-10 are cross-sectional views of semiconductor device 100 along line B-B of semiconductor device 100 at various stages of its fabrication, according to some embodiments. Operations can be performed in a different order or not performed depending on specific applications. It should be noted that method 200 does not produce complete semiconductor device 100. Accordingly, it is understood that additional processes can be provided before, during, and after method 200, and that some other processes can be briefly described herein. Elements in FIGS. 3-10 with the same annotations as elements in FIGS. 1A-1C are described above. The figures provided to describe method 200 are for illustrative purposes only and are not to scale. In addition, the figures may not reflect the actual geometry of the actual structures, features, or films. Some structures, films, or geometries may have been deliberately augmented for illustrative purposes.

Figure 3:
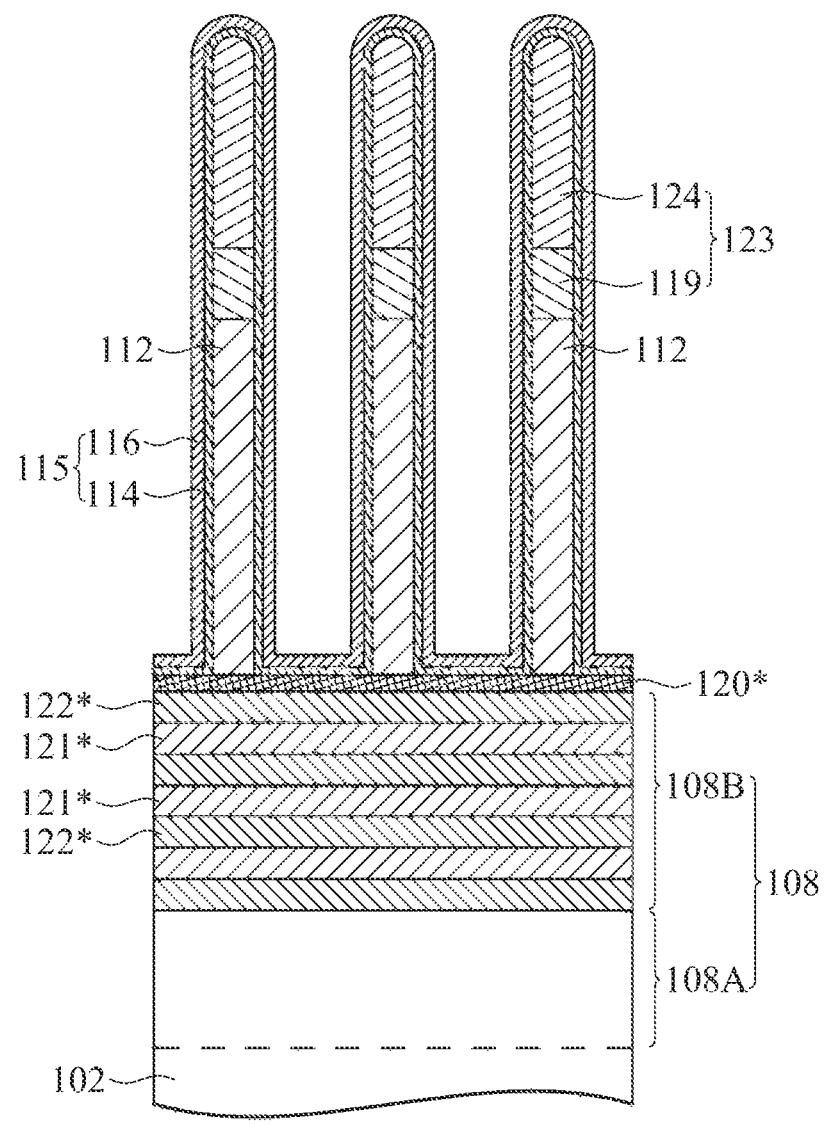
FIGS. 3-10 illustrate cross-sectional views of a semiconductor device with tunable low-k inner air spacers at various stages of its fabrication process, in accordance with some embodiments.

In referring to FIG. 2, method 200 begins with operation 210 and the process of forming polysilicon gate structures on a fin structure over a substrate. For example, as shown in FIG. 3, polysilicon gate structures 112 can be formed on fin structure 108 over substrate 102. In some embodiments, polysilicon gate structures 112 can be formed by blanket deposition of polysilicon, followed by photolithography and etching of the deposited polysilicon. The deposition process can include chemical vapor deposition (CVD), atomic layer deposition (ALD), physical vapor deposition (PVD), other suitable deposition methods, or a combination thereof. Photolithography can include photoresist coating (e.g., spin-on coating), soft baking, mask aligning, exposure, post-exposure baking, developing the photoresist, rinsing, drying (e.g., hard baking), other suitable processes, or a combination thereof. Etching processes can include dry etching, wet etching, and/or other etching methods (e.g., reactive ion etching).

In some embodiments, protective oxide layer 120\* can be formed prior to the formation of polysilicon gate structures 112 to protect underlying fin top portion 108B with alternating semiconductor layers 121\* and 122\*. The formation of protective oxide layer 120\* can include blanket depositing a layer of oxide material on fin top portion 108B followed by a high temperature anneal process. Protective oxide layer 120\* can include a suitable oxide material, such as silicon oxide and can be blanket deposited using a suitable deposition process, such as CVD, ALD, plasma enhanced ALD (PEALD), PVD, or e-beam evaporation. The deposition of the layer of oxide material can be followed by a dry anneal process or a flash anneal process.

In some embodiments, hard mask layer 123 having nitride layer 119 and oxide layer 124 can be patterned on polysilicon gate structures 112. In some embodiments, hard mask layer 123 can include a nitride layer 119 and an oxide layer 124. In some embodiments, nitride layer 119 can include a layer of silicon nitride, SiCN, or other suitable dielectric materials. In some embodiments, oxide layer 124 can include a layer of silicon oxide, or other suitable dielectric materials. Hard mask layer 123 can protect polysilicon gate structures 112 from subsequent processing steps (e.g., during formation of gate spacers 115 and epitaxial fin regions 110). Hard mask layer 123 with two sublayers of nitride layer 119 and oxide layer 124 can achieve better profile control of polysilicon gate structures 112.

In some embodiments, gate spacers 115 having first and second gate spacers 114 and 116 can be deposited on polysilicon gate structures 112 and protective oxide layer 120\*. The formation of gate spacers 115 can include blanket depositing a layer of an insulating material (e.g., an oxide, a nitride, and/or silicon carbon oxynitride material) on polysilicon gate structures 112 and protective oxide layer 120\* by a CVD, a PVD, or an ALD process followed by photolithography and an etching process. In some embodiments, gate spacers 115 can include a first gate spacer 114 and a second gate spacer 116. In some embodiments, first and second gate spacers 114 and 116 can include different insulating materials with different dielectric constants.

Figure 4:
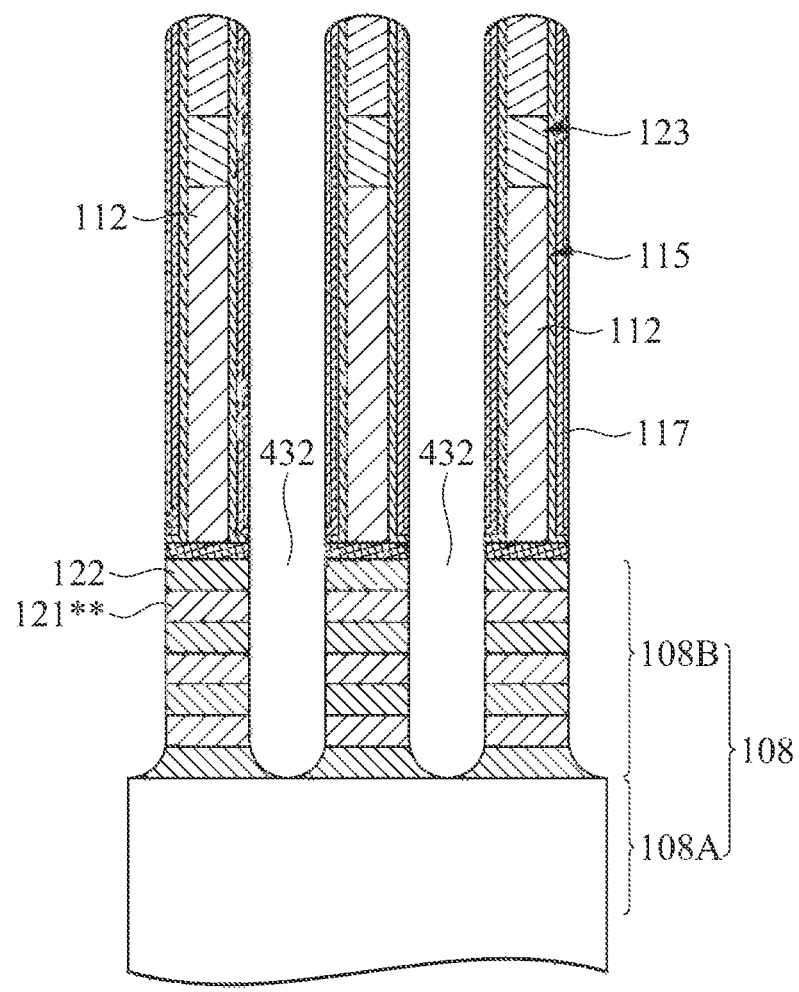

Referring to FIG. 2, in operation 220, an opening is formed in the fin structure between adjacent polysilicon gate structures. For example, as shown in FIG. 4, openings 432 can be formed in fin structure 108 between adjacent polysilicon gate structures 112. In some embodiments, the formation of openings 432 can include a biased etching process to vertically etch back fin top portions 108B on each side of polysilicon gate structures 112. The biased etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the biased etching process, polysilicon gate structures 112 can be protected from being etched by hard mask layer 123 and gate spacers 115. In some embodiments, a dummy nitride layer 117 can be formed on gate spacers 115 to define regions to grow n-type or p-type epitaxial fin regions.

Figure 5:
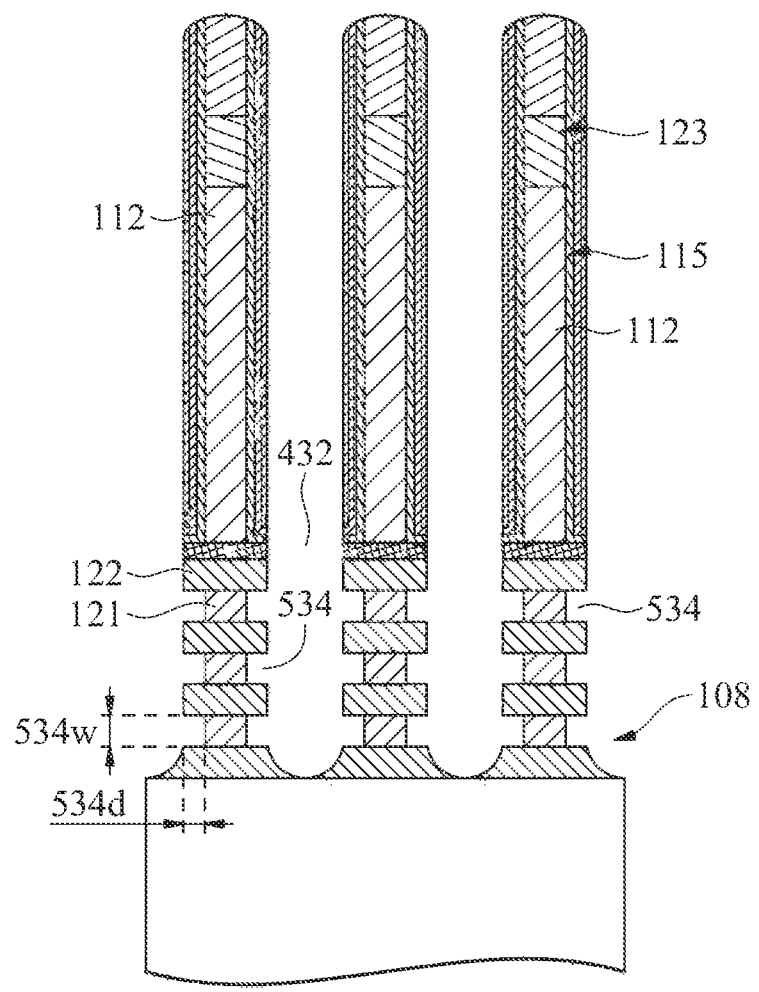

Referring to FIG. 2, in operation 230, a portion of the fin structure is etched laterally to form a recess in the fin structure. For example, as shown in FIG. 5, a portion of each of first semiconductor layers 121 of fin structure 108 is laterally etched back to form recesses 534 in fin structure 108. The lateral etch back can be performed by a dry etching process, a wet etching process, or a combination thereof. The etching process can include a plurality of cycles of etching and purging processes, such as about 3 to about 20 cycles of etching and purging processes. The etching process in each cycle can include using a gas mixture having hydrogen fluoride (HF), nitrogen trifluoride ($NF_3$), a fluorine based gas and a chlorine based gas. The purging process in each cycle can include using a gas mixture having HF and nitrogen ($N_2$). HF in the purging process can remove by-product and/or clean the surface of etched portions for subsequent cycles.

Recesses 534 can each have a dimension 534d (e.g., depth) along an X-axis in a range from about 5 nm to about 8 nm, and a dimension 534w (e.g., depth) along an Z-axis in a range from about 6 nm to about 10 nm. In some embodiments, recesses 534 can have a ratio of dimension 534d to dimension 534w ranging from about 0.5 to about 2. Dimension 534w can be dependent on width 121t of semiconductor layers 121. Recesses 534 can extend deeper than the side of spacer 115 facing polysilicon gate structures 112, as shown in FIG. 5. Dimension 534d can be greater than thickness of gate spacers 115 by about 0.5 nm to about 2 nm. Etching recesses 534 deeper than gate spacers 115 can prevent any residual portions of first semiconductor layers 121 under gate spacers 115 during the removal of first semiconductor layers 121 in subsequent gate replacement process.

Figure 6:
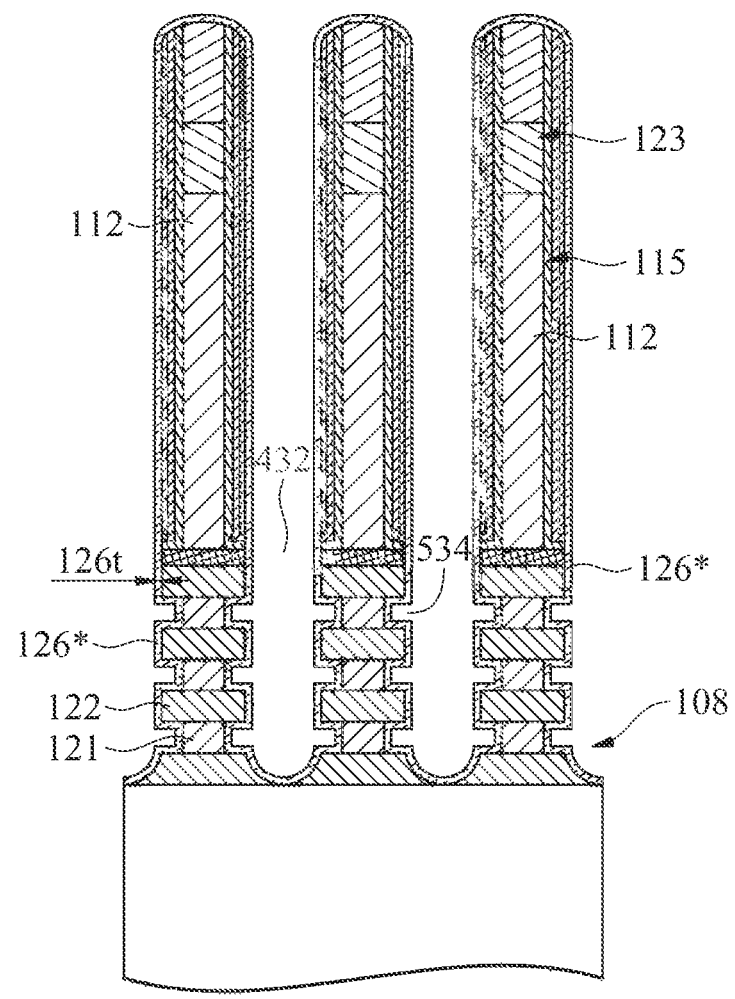

Referring to FIG. 2, in operation 240, a first dielectric spacer layer is formed on the fin structure and the polysilicon gate structures. For example, as shown in FIG. 6, first dielectric spacer layer 126\* can be conformally deposited on the structure of FIG. 5. In some embodiments, first dielectric spacer layer 126\* can be deposited by CVD, ALD, or other suitable deposition methods. The conformal deposition can be performed at a temperature ranging from about 250° C. to about 400° C. with a pressure ranging from about 5 Torr to about 7 Torr. In some embodiments, the conformal deposition of first dielectric spacer layer can include a plurality of cycles of deposition processes. In some embodiments, the deposition process can include using reaction gases, such as Tetramethyldisiloxane (TMDSO, AP) with a flow rate ranging from about 3 to about 10 sccm. In each cycle, a single layer of dielectric material can be deposited in recesses 534. In some embodiments, the deposition rate of first dielectric spacer layer 126\* can be slow, for example, ranging from about 1 A/min to about 100 A/min, to promote conformal deposition of the dielectric material in recesses 534\*.

In some embodiments, first dielectric spacer layer 126\* can include a dielectric material composed of silicon, oxygen, carbon, and/or nitrogen. The concentrations of silicon, oxygen, carbon, and nitrogen in the dielectric material for first dielectric spacer layer 126\* can depend on the desired dielectric constant for first dielectric spacer layer 126\*. Varying concentrations of silicon, oxygen, carbon, and nitrogen in the dielectric material can vary the dielectric constant of first dielectric spacer layer 126\*. In some embodiments, first dielectric spacer layer 126 can include a layer of silicon oxycarbonitride (SiOCN), a layer of silicon carbon nitride (SiCN), a layer of silicon oxide carbide (SiOC), or a combination thereof. In some embodiments, first dielectric spacer layer 126\* can have a thickness 126t ranging from about 1 nm to about 3 nm and a dielectric constant ranging from about 3.5 to about 4. If thickness 126t is smaller than 1 nm, first dielectric spacer layer 126 may not protect inner air spacer 130 formed in subsequent process. If thickness 126t is larger than 3 nm, the vertical dimension 130h of inner air spacer 130 may be reduced by first dielectric spacer layer 126*.

Figure 7:
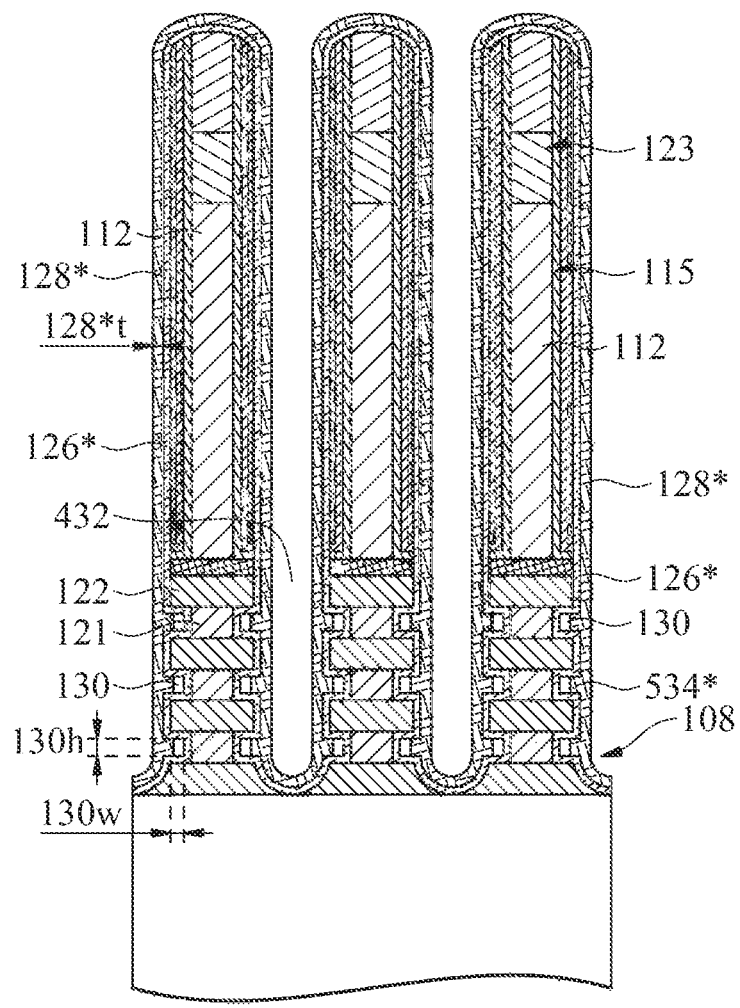

Referring to FIG. 2, in operation 250, a second dielectric spacer layer is formed on the first dielectric spacer layer, and the first and the second dielectric spacer layers seal an inner air spacer in the recess. For example, as shown in FIG. 7, second dielectric spacer layer 128* can be formed on first dielectric spacer layer 126*. The second dielectric spacer layer 128* is deposited on first dielectric spacer layers 126* in such a manner that inner air spacers 130 can be formed within recesses 534*. As shown in FIG. 7, second dielectric spacer layer 128* can be deposited by CVD, or other suitable deposition methods using deposition parameters such that second dielectric spacer layer 128* deposits conformally on all portions of first dielectric spacer layer 126* except for the portions of first dielectric spacer layer 126* within recesses 534* under polysilicon gate structures 112. Such deposition of second dielectric spacer layer 128* can be performed at a temperature ranging from about 250° C. to about 400° C. with a pressure ranging from about 7 Torr to about 9 Torr.

In some embodiments, the deposition process can include using reaction gases, such as Tetramethyldisiloxane (TMDSO, AP) with a flow rate ranging from about 3 to about 10 sccm. The deposition rate of second dielectric spacer layer 128* can be high, for example, ranging from about 10 A/min to about 1000 A/min, to prevent conformal deposition of second dielectric spacer layer 128* on first dielectric spacer layer 126* within recesses 534* having dimension 534w in a range from about 6 nm to about 10 nm. In some embodiments, during the deposition process, second dielectric spacer layer 128* can seal an air gap within recesses 534* to form inner air spacers 130. In some embodiments, second dielectric spacer layer 128* can have a higher deposition rate than first dielectric spacer layer 126* to prevent conformal deposition of second dielectric spacer layer within recesses 534* and form inner air spacer 130. The above described deposition processes of first dielectric spacer layer 126* and second dielectric spacer layer 128* to form inner air spacers 130 can be referred to as a two-step deposition process.

In some embodiments, second dielectric spacer layer 128* can include a dielectric material composed of silicon, oxygen, carbon, and/or nitrogen. The concentrations of silicon, oxygen, carbon, and nitrogen in the dielectric material for second dielectric spacer layer 128* can depend on the desired dielectric constant for second dielectric spacer layer 128*. Varying concentrations of silicon, oxygen, carbon, and nitrogen in the dielectric material can vary the dielectric constant of second dielectric spacer layer 128*. In some embodiments, second dielectric spacer layer 128* can include a layer of silicon oxycarbonitride (SiOCN), a layer of silicon carbon nitride (SiCN), a layer of silicon oxide carbide (SiOC), or a combination thereof. In some embodiments, first dielectric spacer layer 126* and second dielectric spacer layer 128* can include a same dielectric material having a same dielectric constant. In some embodiments, first dielectric spacer layer 126* and second dielectric spacer layer 128* can include a different dielectric material having a different dielectric constant. In some embodiments, second dielectric spacer layer 128* can have a thickness 128*t ranging from about 1 nm to about 3 nm and a dielectric constant ranging from about 3.5 to about 4.

In some embodiments, instead of the two-step deposition process, first dielectric spacer layer 126* and second dielectric spacer layer 128* can be formed by a one-step continuous deposition process. During the one-step continuous deposition process, first dielectric spacer layer 126* and second dielectric spacer layer 128* can be deposited at a same deposition rate unlike the two-step deposition process and can include a same deposition material. The deposition rate in the one-step continuous deposition process can be higher than the deposition rate of first dielectric spacer layer 126* but lower than the deposition rate of second dielectric spacer layer 128* of the two-step deposition process. First dielectric spacer layer 126* formed by the one-step continuous deposition process can be less conformal within recesses 534* due to the higher deposition rate than first dielectric spacer layer 126* formed by the two-step deposition process. As such, inner air spacers 130 formed in the one-step continuous deposition process can be smaller in dimension and/or volume compared to inner air spacers 130 formed in the two-step deposition process. The two-step deposition process can have better dimension control of inner air spacers 130 than the one-step deposition process because of the more conformal first dielectric spacer layer 126* formed in the two-step deposition process.

Figures 8A, 8B:
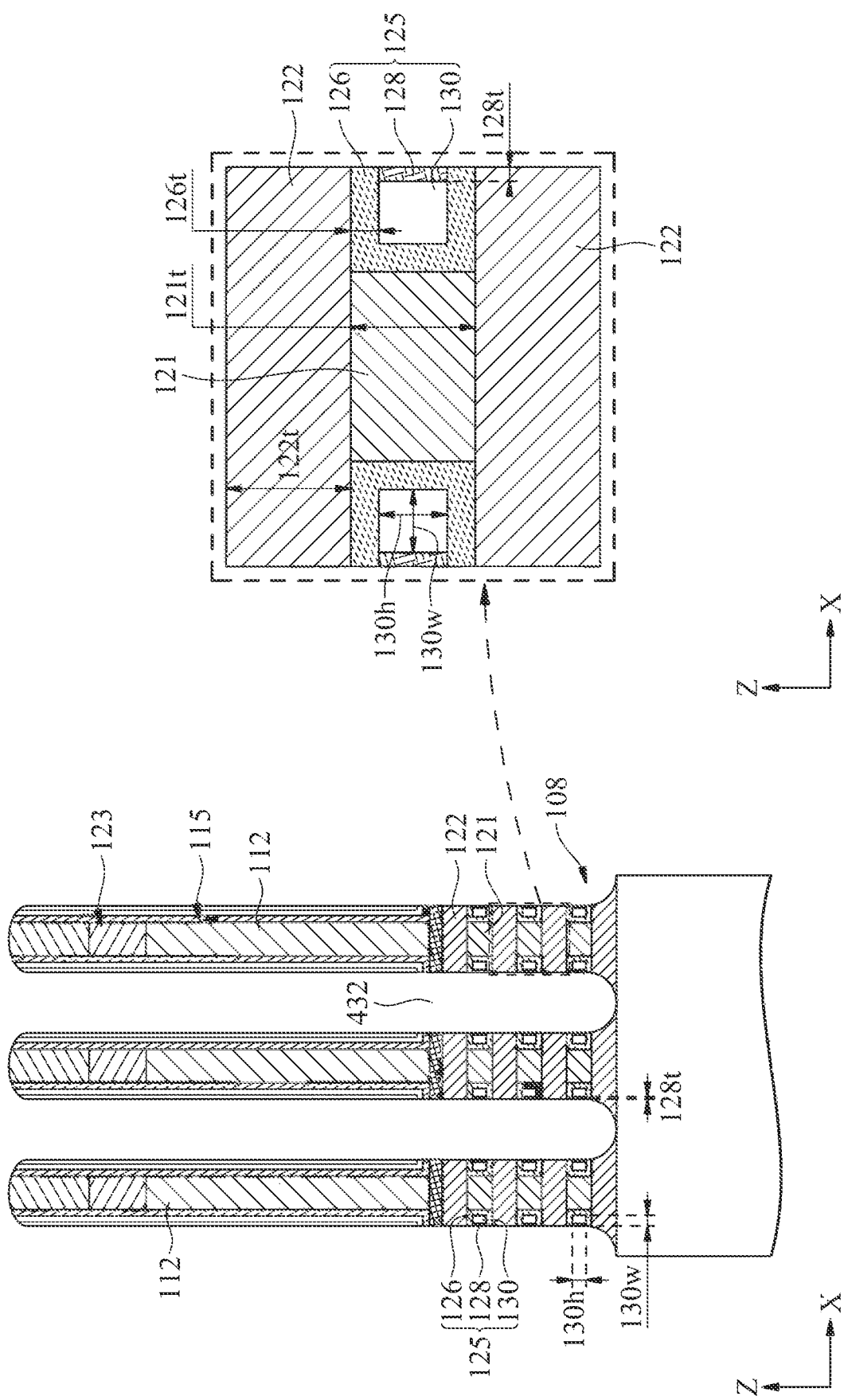

Referring to FIG. 2, in operation 260, portions of the first and the second dielectric spacer layers are etched to form an inner spacer structure having the inner air spacer. For example, as shown in FIGS. 8A and 8B, all the portions of first and second dielectric spacer layers 126* and 128* are etched off except for those within recesses 534* to form first and second dielectric spacer layers 126 and 128. In some embodiments, the etch process can include a wet etching or a dry etching process. In some embodiments, the etch process can include a dry etching process using a gas mixture of HF and $NH_3$. In some embodiments, during the etch process, first and second dielectric spacer layers 126* and 128* are removed from semiconductor layers 122 and bottoms of openings 432 to expose surfaces of fin structure 108 for subsequent growth of epitaxial fin regions. Second dielectric spacer layer 128 can be formed to protect inner air spacer 130. In some embodiments, second dielectric spacer layer 128 can have a thickness 128t ranging from about 1 nm to about 3 nm. If thickness 128t is smaller than 1 nm, second dielectric spacer layer 128 may not protect inner air spacer 130 and subsequent epitaxial fin regions may grow into inner air spacers 130, which can increase device current leakage between gate structures and epitaxial fin regions 110. If thickness 128t is larger than 3 nm, horizontal dimension 130w of inner air spacer 130 may be reduced by second dielectric spacer layer 128.

In some embodiments, inner air spacer 130 can be sealed on all sides by first dielectric spacer layer 126 and second dielectric spacer layer 128 and can be wrapped around semiconductor layers 122 along a Z-axis, as shown in FIGS. 8B-SC. In some embodiments, inner air spacer 130 can include an air gap (also referred to as "air gap 130") having a dielectric constant of about 1. In some embodiments, inner air spacer 130 can have a dimension along an X-axis 130w (e.g., width) ranging from about 2 nm to about 6 nm. In some embodiments, inner air spacer 130 can have a dimension along a Z-axis 130h (e.g., height) ranging from about 4 nm to about 10 nm. In some embodiments, inner spacer 130 can have a ratio of a dimension along a Z-axis to a dimension along an X axis ranging from about 0.5 to about 5. In some embodiments, the dimensions of inner air spacer 130 can be tuned by thickness 126t of first dielectric spacer layer 126 and thickness 128t of second dielectric spacer layer 128. According to some embodiments, the dielectric constant of inner spacer structure 125 with inner air spacer 130 can be reduced compared to inner spacer structures without inner air spacers. The sealing of inner air spacer 130 by first dielectric spacer layer 126 and second dielectric spacer layer 128 can prevent subsequently-formed epitaxial fin regions from growing into inner air spacer 130. The growth of epitaxial fin regions into inner air spacer 130 can increase device current leakage between gate structures and epitaxial fin regions. Thus, the formation of epitaxial defects in epitaxial fin regions can be prevented by confining the epitaxial growth of epitaxial fin regions on low-k first and second dielectric spacer layers 126 and 128 of inner spacer structures 125.

Figure 9:
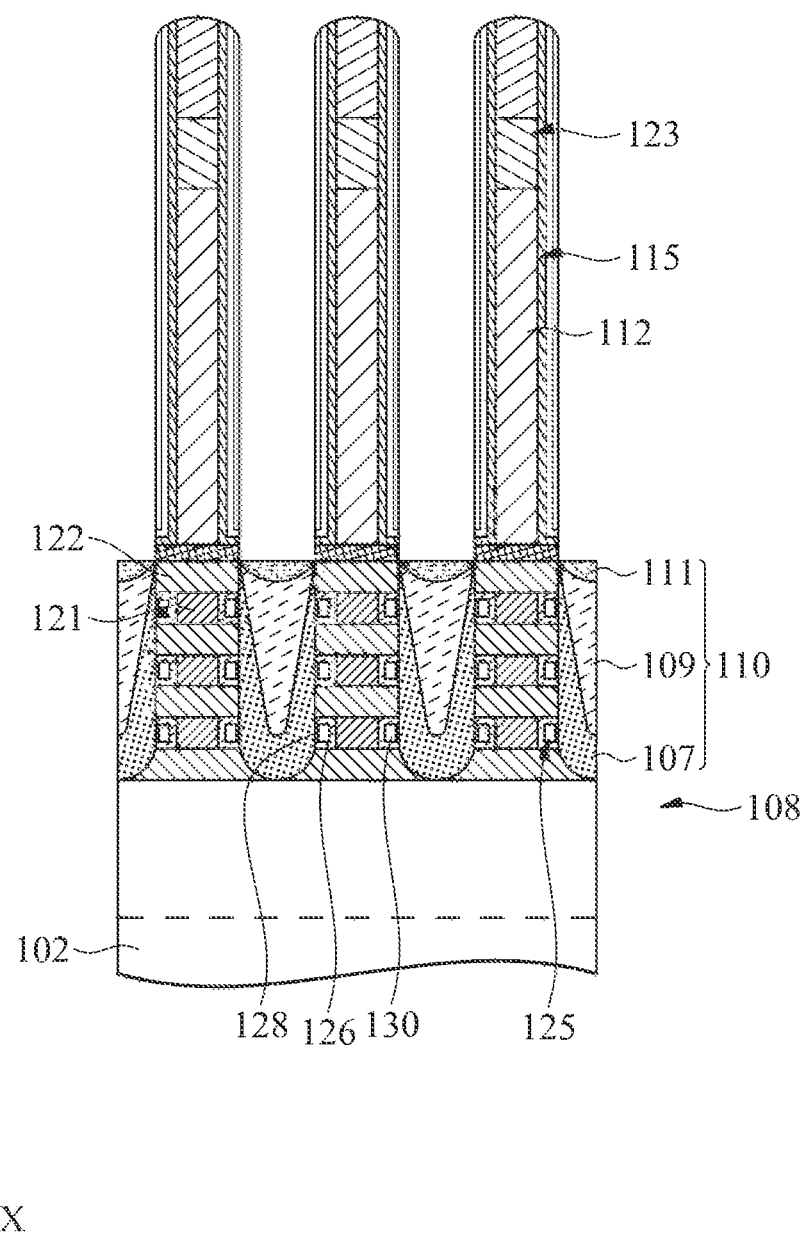

Referring to FIG. 2, in operation 270, epitaxial fin regions are formed on the fin structure adjacent to the inner spacer structure. For example, as shown in FIG. 9, epitaxial fin regions 110 can be formed on fin structure 108 adjacent to inner spacer structures 125. In some embodiments, epitaxial fin regions 110 can be grown on portions of fin structure 108 that are not underlying polysilicon gate structures 112. In some embodiments, epitaxial fin regions 110 can have any geometric shape, for example, polygonal, elliptical, or circular. Epitaxial fin regions 110 can include an epitaxially-grown semiconductor material. In some embodiments, the epitaxially grown semiconductor material is the same material as the material of substrate 102, In some embodiments, the epitaxially-grown semiconductor material can include a different material from the material of substrate 102. The epitaxially-grown semiconductor material can include: (i) a semiconductor material such as, germanium or silicon; (ii) a compound semiconductor material such as, gallium arsenide and/or aluminum gallium arsenide; or (iii) a semiconductor alloy such as, silicon germanium and/or gallium arsenide phosphide. According to some embodiments, sealed by first dielectric spacer layer 126 and second dielectric spacer layer 128, epitaxial fin regions 110 may not grow into inner air spacer 130. According to some embodiments, inner spacer structure 125 having inner air spacer 130 can prevent formation of epitaxial defect as a result of confined epitaxial growth by first and second dielectric spacer layers 126 and 128.

Epitaxial fin regions 110 can be p-type or n-type. P-type epitaxial fin regions 110 can include SiGe and can be in-situ doped during an epitaxial growth process using p-type dopants, such as boron, indium, or gallium. In some embodiments, n-type epitaxial fin regions 110 can include Si and may be in-situ doped during an epitaxial growth process using n-type dopants, such as phosphorus or arsenic.

In some embodiments, epitaxial fin regions 110 can have a plurality of epitaxial fin sub-regions that can differ from each other based on, for example, doping concentration, and/or epitaxial growth process conditions. Referring to FIG. 9, epitaxial fin regions 110 can include first epitaxial fin sub-regions 107, second epitaxial fin sub-regions 109, and third epitaxial fin sub-regions 111. First epitaxial fin sub-regions 107, second epitaxial fin sub-regions 109, and third epitaxial fin sub-regions 111 can have varying dopant concentration with respect to each other, according to some embodiments. In some embodiments, second epitaxial fin sub-regions 109 can have a higher dopant concentration than first epitaxial fin sub-regions 107. Third epitaxial fin sub-regions 111 can have a lower dopant concentration than second epitaxial fin sub-regions 109. According to some embodiments, first epitaxial fin sub-regions 109 can serve as buffers between fin structure 108 and second epitaxial fin sub-regions 111 to reduce leakage current during off-stage. Third epitaxial fin sub-regions 111 can serve as a capping layer to protect second epitaxial fin sub-regions 109.

Figure 10:
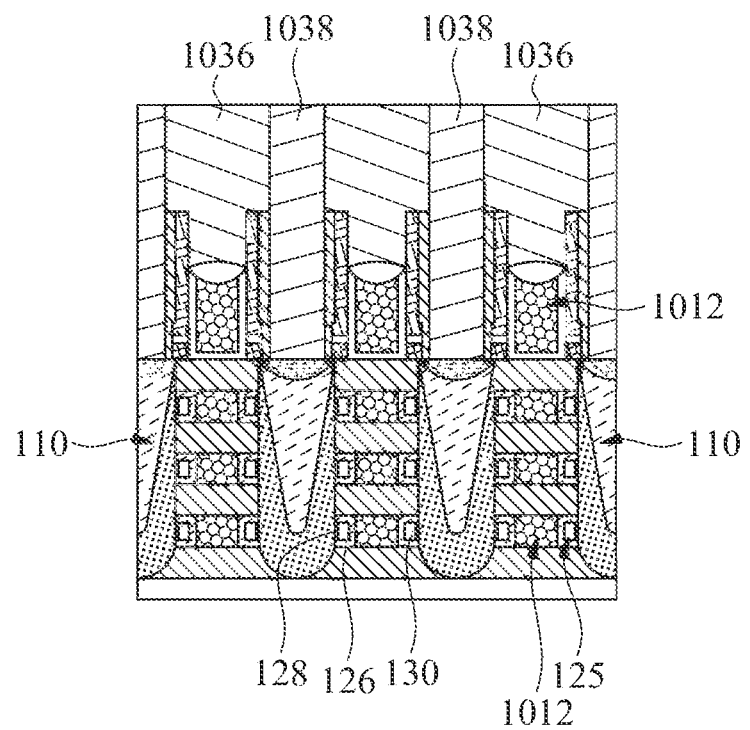

In some embodiments, the formation of epitaxial fin regions 110 can be followed by formation of other elements, such as metal gate replacement, S/D contact structures and gate contact structures, which are not described in details for the sake of clarity. As shown in FIG. 10, metal gate structures 1012 can replace polysilicon gate structures 112 and semiconductor layers 121. Gate contact structures 1036 can be formed on metal gate structures 1012. S/D contact structures 1038 can be formed on epitaxial fin regions 110. According to some embodiments, semiconductor device 100 can be incorporated into an integrated circuit through the use of metal gate structures, gate contact structures, S/D contact structures, and other structural components such as conductive vias, conductive lines, dielectric layers, passivation layers, etc., that are not shown for the sake of clarity.

The present disclosure provides example structures of tunable low-k inner air spacer (e.g., inner air spacers 130) in FET devices (e.g., gate-all-around (GAA) FETs, finFETs, GAA finFETs, or planar FETs) in a semiconductor device and/or in an integrated circuit (IC) and example methods for fabricating the same. According to some embodiments, tunable low-k inner air spacer can be formed between the gate structure (e.g., gate structures 112) and the epitaxial S/D region (e.g., S/D regions 110) and sealed by a first dielectric spacer layer (e.g., first dielectric spacer layer 126) and a second dielectric spacer layer (e.g., second dielectric spacer layer 128). In some embodiments, the first dielectric spacer layer and the second dielectric spacer layer can be formed by a two-step low-k dielectric spacer layer deposition method and the first and the second dielectric spacer layers can include dielectric materials different from each other. In some embodiments, the first dielectric spacer layer and the second dielectric spacer layer can be formed by a one-step low-k dielectric spacer layer deposition method and the first and the second dielectric spacer layers can include the same dielectric materials. In some embodiments, the vertical and horizontal dimensions of the inner air spacer can be tuned by the thicknesses of the first dielectric spacer layer and the second dielectric spacer layer, respectively. In some embodiments, the tunable low-k inner air spacer can include an air gap having a dielectric constant about 1 and can reduce the dielectric constant of the inner spacer structure including the inner air spacer, the first and second dielectric spacer layers, and thus reducing the capacitance between the gate structure and the epitaxial fin regions. In some embodiments, device performance of FETs having tunable low-k inner air spacers can be improved by about 2% to about 15% compared to the device performance of PETS without such tunable low-k inner air spacers.

In some embodiments, a method includes forming a fin structure on a substrate, forming a polysilicon gate structure on a first portion of the fin structure, forming an opening in a second portion of the fin structure, wherein the first and second portions of the fin structure is adjacent to each other, forming a recess laterally on a sidewall of the first portion of the fin structure underlying the polysilicon gate structure, and forming an inner spacer structure within the recess. The inner spacer structure comprises an inner air spacer enclosed by a first dielectric spacer layer and a second dielectric spacer layer.

In some embodiments, a method includes forming a fin structure on a substrate, forming a polysilicon gate structure on a first portion of the fin structure, forming an opening in a second portion of the fin structure, forming a recess laterally on a sidewall of the first portion of the fin structure underlying the polysilicon gate structure, and forming an inner air spacer between first and second dielectric spacer layers deposited at a same deposition rate within.

In some embodiments, a semiconductor structure includes a fin structure disposed on a substrate, a gate structure disposed over a first portion of the fin structure, an inner spacer structure disposed within a recess of the fin structure underlying the gate structure, and an epitaxial source/drain region disposed on a second portion of the fin structure and adjacent to the inner spacer structure and the fin structure. The inner spacer structure comprises a first dielectric spacer layer disposed conformally along sidewalls of the recess, a second dielectric spacer layer disposed non-conformally on the first dielectric spacer layer, and an inner air spacer enclosed between the first and the second dielectric spacer layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of semiconductor layers;
a gate structure wrapped around the plurality of semiconductor layers; and
an inner spacer structure disposed within a recess between the plurality of semiconductor layers, wherein:
the inner spacer structure comprises a first dielectric spacer layer, a second dielectric spacer layer, and an inner air spacer;
the first dielectric spacer layer comprises a dielectric material disposed conformally along sidewalls of the recess and in contact with the plurality of semiconductor layers;
the second dielectric spacer layer seals an opening of the recess and comprises the dielectric material; and
the inner air spacer is enclosed by the first and the second dielectric spacer layers and directly adjacent to the dielectric material of the first dielectric layer.

2. The semiconductor device of claim 1, wherein the gate structure is in contact with the first dielectric spacer layer.

3. The semiconductor device of claim 1, further comprising a source/drain region in contact with the first dielectric spacer layer, the second dielectric spacer layer, and the plurality of semiconductor layers.

4. The semiconductor device of claim 1, wherein the dielectric material is composed of silicon, oxygen, carbon, and nitrogen.

5. The semiconductor device of claim 1, wherein a thickness of the first dielectric spacer layer ranges from about 1 nm to about 3 nm.

6. The semiconductor device of claim 1, wherein the inner air spacer has a width ranging from about 2 nm to about 6 nm and a height ranging from about 4 nm to about 10 nm.

7. The semiconductor device of claim 1, wherein a thickness of the second dielectric spacer layer ranges from about 1 nm to about 3 nm.

8. The semiconductor device of claim 1, wherein a ratio of a vertical dimension of the inner air spacer to a horizontal dimension of the inner air spacer ranges from about 0.5 to about 5.

9. A semiconductor device, comprising:
a plurality of semiconductor layers disposed on a substrate;
a source/drain region on the substrate and in contact with the plurality of semiconductor layers;
a gate structure wrapped around the plurality of semiconductor layers; and
an inner spacer structure disposed between the gate structure, the source/drain region, and end portions of the plurality of semiconductor layers, wherein:
the inner spacer structure comprises a dielectric spacer layer and an inner air spacer enclosed by the dielectric spacer layer;
a first side of the dielectric spacer layer is in contact with the air spacer;
a second side of the dielectric spacer layer opposite to the first side is in contact with the source/drain region;
the dielectric spacer layer comprises a single dielectric material conformally deposited along sidewalls of the gate structure and the plurality of semiconductor layers, wherein a thickness of the single dielectric material on sidewalls of the gate structure is substantially equal to a thickness of the single dielectric material on sidewalls of the plurality of semiconductor layers; and
the single dielectric material is in contact with the gate structure, the source/drain region, the inner air spacer, and the plurality of semiconductor layers.

10. The semiconductor device of claim 9, wherein a thickness of the dielectric spacer layer ranges from about 1 nm to about 3 nm.

11. The semiconductor device of claim 9, wherein the single dielectric material is composed of silicon, oxygen, carbon, and nitrogen.

12. The semiconductor device of claim 9, wherein the inner air spacer has a width ranging from about 2 nm to about 6 nm and a height ranging from about 4 nm to about 10 nm.

13. The semiconductor device of claim 9, wherein a ratio of a vertical dimension of the inner air spacer to a horizontal dimension of the inner air spacer ranges from about 0.5 to about 5.

14. A semiconductor device, comprising:
a plurality of semiconductor layers disposed on a substrate;
source/drain regions disposed on opposite ends of the plurality of semiconductor layers;
a gate structure wrapped around the plurality of semiconductor layers;
inner spacer structures disposed on opposite ends of the gate structure and between the plurality of semiconductor layers, wherein:
each of the inner spacer structures comprises a first dielectric spacer layer, a second dielectric spacer layer, and an inner air spacer enclosed by the first and second dielectric spacer layers;

a first side of the second dielectric layer is in contact with the air spacer;

a second side of the second dielectric layer opposite to the first side is in contact with the source/drain regions;

the first dielectric spacer layer comprises a single dielectric material in contact with the plurality of semiconductor layers and the gate structure; and the inner air spacer is in contact with the single dielectric material and the second dielectric spacer layer.

15. The semiconductor device of claim 14, wherein the source/drain regions are in contact with the first dielectric spacer layer, the second dielectric spacer layer, and the plurality of semiconductor layers.

16. The semiconductor device of claim 14, wherein the second dielectric spacer layer comprises a same dielectric material as the first dielectric spacer layer.

17. The semiconductor device of claim 14, wherein the single dielectric material is composed of silicon, oxygen, carbon, and nitrogen.

18. The semiconductor device of claim 14, wherein a thickness of the first dielectric spacer layer ranges from about 1 nm to about 3 nm.

19. The semiconductor device of claim 14, wherein a thickness of the second dielectric spacer layer ranges from about 1 nm to about 3 nm.

20. The semiconductor device of claim 14, wherein a ratio of a vertical dimension of the inner air spacer to a horizontal dimension of the inner air spacer ranges from about 0.5 to about 5.

* * * * *